(12) United States Patent
Carey et al.

(10) Patent No.: US 8,617,644 B2
(45) Date of Patent: Dec. 31, 2013

(54) METHOD FOR MAKING A CURRENT-PERPENDICULAR-TO-THE-PLANE (CPP) MAGNETORESISTIVE SENSOR CONTAINING A FERROMAGNETIC ALLOY REQUIRING POST-DEPOSITION ANNEALING

(75) Inventors: Matthew J. Carey, San Jose, CA (US); Shekar B Chandrashekariaih, San Jose, CA (US); Jeffrey R. Childress, San Jose, CA (US); Young-suk Choi, Los Gatos, CA (US); John Creighton Read, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/415,808

(22) Filed: Mar. 8, 2012

(65) Prior Publication Data

US 2013/0236639 A1    Sep. 12, 2013

(51) Int. Cl.
 *G11B 5/84*    (2006.01)
(52) U.S. Cl.
 USPC .......................................... 427/130; 360/324
(58) Field of Classification Search
 USPC ..................................... 427/130; 360/324.12
 See application file for complete search history.

(56) References Cited

U.S. PATENT DOCUMENTS

| | | | |
|---|---|---|---|
| 6,998,061 B1 * | 2/2006 | Cross | 216/22 |
| 7,428,130 B2 | 9/2008 | Jogo et al. | |
| 7,580,229 B2 | 8/2009 | Carey et al. | |
| 7,746,603 B2 | 6/2010 | Gill | |
| 7,820,455 B2 | 10/2010 | Gill et al. | |
| 7,826,182 B2 * | 11/2010 | Carey et al. | 360/324.12 |
| 7,855,860 B2 | 12/2010 | Ishiwata | |
| 7,978,439 B2 | 7/2011 | Zhang et al. | |
| 2002/0131219 A1 * | 9/2002 | Mack et al. | 360/324.12 |
| 2004/0086751 A1 * | 5/2004 | Hasegawa et al. | 428/692 |
| 2008/0144235 A1 * | 6/2008 | Gill | 360/324.12 |
| 2008/0316657 A1 * | 12/2008 | Zhang et al. | 360/324.11 |
| 2009/0229111 A1 * | 9/2009 | Zhao et al. | 29/603.08 |
| 2009/0284873 A1 * | 11/2009 | Gill | 360/314 |
| 2011/0134563 A1 | 6/2011 | Komagaki et al. | |

OTHER PUBLICATIONS

Tezuka, et al., "175% tunnel magnetoresistance at room temperature and high thermal stability using C02FeAl0.5Si0.5 full-Heusler alloy electrodes", Applied Physics Letters 89, 252508 (2006).

(Continued)

*Primary Examiner* — Sarah R Anderson
(74) *Attorney, Agent, or Firm* — Thomas R. Berthold

(57) ABSTRACT

A method for making a current-perpendicular-to the-plane giant magnetoresistance (CPP-GMR) sensor with a Heusler alloy pinned layer on the sensor's Mn-containing antiferromagnetic pinning layer uses two annealing steps. A layer of a crystalline non-Heusler alloy ferromagnetic material, like Co or CoFe, is deposited on the antiferromagnetic pinning layer and a layer of an amorphous X-containing ferromagnetic alloy, like a CoFeBTa layer, is deposited on the Co or CoFe crystalline layer. After a first in-situ annealing of the amorphous X-containing ferromagnetic alloy, the Heusler alloy pinned layer is deposited on the amorphous X-containing ferromagnetic layer and a second high-temperature annealing step is performed to improve the microstructure of the Heusler alloy pinned layer.

13 Claims, 5 Drawing Sheets

(56) References Cited

OTHER PUBLICATIONS

Yoo et al., "Effect of Diffusion Barrier in the Thermally Annealed Exchange-Biased IrMn—CoFe Electrode in Magnetic Tunnel Junctions", IEEE Transactions on Magnetics, vol. 38. No. 5 Sep. 2002.

Kim et al., "Enhanced Exchange Bias and Thermal Stability of Magnetic Tunnel Junctions with Ta Blocking Layer", J. Kor. Phys. Soc. 45(3) Sep. 2004 pp. 683-686.

Xu et al., "Synthetic antiferromagnet with Heusler alloy Co2FeAl ferromagnetic layers", J. Appl. Phys. 106, 123902 (2009).

* cited by examiner

METHOD FOR MAKING A CURRENT-PERPENDICULAR-TO-THE-PLANE (CPP) MAGNETORESISTIVE SENSOR CONTAINING A FERROMAGNETIC ALLOY REQUIRING POST-DEPOSITION ANNEALING

BACKGROUND OF THE INVENTION

1. Field of the Invention

The invention relates generally to a current-perpendicular-to-the-plane (CPP) magnetoresistive sensor that operates with the sense current directed perpendicularly to the planes of the layers making up the sensor stack, and more particularly to an improved method for making a CPP sensor that contains a ferromagnetic alloy, like a Heusler alloy, that requires high-temperature post-deposition annealing.

2. Background of the Invention

One type of conventional magnetoresistive (MR) sensor used as the read head in magnetic recording disk drives is a "spin-valve" sensor based on the giant magnetoresistance (GMR) effect. A GMR spin-valve sensor has a stack of layers that includes two ferromagnetic layers separated by a nonmagnetic electrically conductive spacer layer, which is typically formed of Cu or Ag. One ferromagnetic layer, typically called the "reference" layer, has its magnetization direction fixed, such as by being pinned by exchange coupling with an adjacent antiferromagnetic "pinning" layer, and the other ferromagnetic layer, typically called the "free" layer, has its magnetization direction free to rotate in the presence of an external magnetic field. With a sense current applied to the sensor, the rotation of the free-layer magnetization relative to the fixed-layer magnetization is detectable as a change in electrical resistance. If the sense current is directed perpendicularly through the planes of the layers in the sensor stack, the sensor is referred to as current-perpendicular-to-the-plane (CPP) sensor.

In a magnetic recording disk drive CPP-GMR read sensor or head, the magnetization of the fixed or pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance.

The fixed or pinned ferromagnetic layer in a CPP-GMR sensor used in read heads may be a single pinned layer (sometimes called a "simple" pinned layer) or part of an antiparallel (AP) pinned structure. In a simple pinned structure the pinned layer has its magnetization pinned by being exchange-coupled to an antiferromagnetic pinning layer, which is typically a Mn alloy like IrMn. In an AP-pinned structure first (AP1) and second (AP2) ferromagnetic layers are separated by a nonmagnetic antiparallel coupling (APC) layer with the magnetization directions of the two AP-pinned ferromagnetic layers oriented substantially antiparallel. The AP1 layer, which is in contact with the antiferromagnetic layer on one side and the nonmagnetic APC layer on the other side, is the pinned layer. The AP2 layer, which is in contact with the nonmagnetic APC layer on one side and the sensor's electrically conductive spacer layer on the other side, is the reference layer. The AP-pinned structure minimizes magnetostatic coupling between the reference layer and the CPP-SV free ferromagnetic layer.

The materials making up the ferromagnetic layers are typically crystalline alloys of CoFe or NiFe. However, Heusler alloys, which are chemically ordered alloys like $Co_2MnX$ (where X is one or more of Ge, Si, Sn, Ga or Al) and $Co_2FeZ$ (where Z is one or more of Ge, Si, Al, Sn or Ga), are known to have high spin-polarization and result in an enhanced magnetoresistance and are thus desirable ferromagnetic materials to use in one or both of the reference layer and free layer. Heusler alloys are usually deposited directly on a layer of a crystalline ferromagnetic material such as Co or CoFe. Other materials with high spin-polarization are non-Heusler alloys of the form CoFeX (where X is one or more of Ge, Al, Si or Ga).

Heusler alloys and non-Heusler alloys of the form CoFeX (where X is one or more of Ge, Al, Si or Ga) require significant high-temperature post-deposition annealing to achieve chemical ordering and high spin-polarization. However, at high annealing temperatures the Mn in the antiferromagnetic pinning layer diffuses into other layers in the sensor stack, which reduces the pinning strength and alters the desired composition of the Heusler alloy. This results in degraded sensor performance. The insertion of an amorphous CoFeB ferromagnetic layer at the interface between the antiferromagnetic pinning layer and the ferromagnetic pinned layer has been suggested to block the diffusion of Mn. However, after post-deposition annealing the sensor with the CoFeB interface layer exhibits only marginal improvement in magnetoresistance.

What is needed is an improved method for making a CPP-GMR sensor that has one or more ferromagnetic layers formed of a material, like a Heusler alloy, that requires high-temperature post-deposition annealing.

SUMMARY OF THE INVENTION

The invention relates to method for making a CPP-GMR sensor that has a Heusler alloy pinned layer on the sensor's Mn-containing antiferromagnetic pinning layer. A layer of a crystalline non-Heusler alloy ferromagnetic material such as Co or CoFe is deposited on the antiferromagnetic pinning layer, and a layer of an amorphous X-containing ferromagnetic alloy is deposited on the Co or CoFe crystalline layer. The amorphous X-containing ferromagnetic layer comprises an alloy of one or more of cobalt (Co), iron (Fe) and nickel (Ni) that also contains sufficient boron (B) to render the alloy substantially amorphous, and the element X is tantalum (Ta), titanium (Ti), zirconium (Zr), niobium (Nb), silicon (Si) or tungsten (W). The preferred amorphous X-containing ferromagnetic layer is a CoFeBTa layer. An in-situ annealing is then performed. After in-situ annealing of the amorphous X-containing ferromagnetic alloy (e.g., the CoFeBTa layer), the Heusler alloy pinned layer is deposited on the amorphous X-containing ferromagnetic layer and a second high-temperature annealing step is performed to improve the microstructure of the Heusler alloy. The remaining sensor layers, including the nonmagnetic spacer layer, a non-Heusler alloy ferromagnetic free layer and the capping layer are deposited, followed by a longer lower-temperature annealing in the presence of a magnetic field to induce magnetic anisotropy in the antiferromagnetic layer and thus cause exchange-biasing of the pinned layer. If the ferromagnetic free layer is also a Heusler alloy, then the second annealing step is performed after deposition of the Heusler alloy ferromagnetic free layer.

For a fuller understanding of the nature and advantages of the present invention, reference should be made to the following detailed description taken together with the accompanying figures.

DETAILED DESCRIPTION OF THE INVENTION

Figure 1:
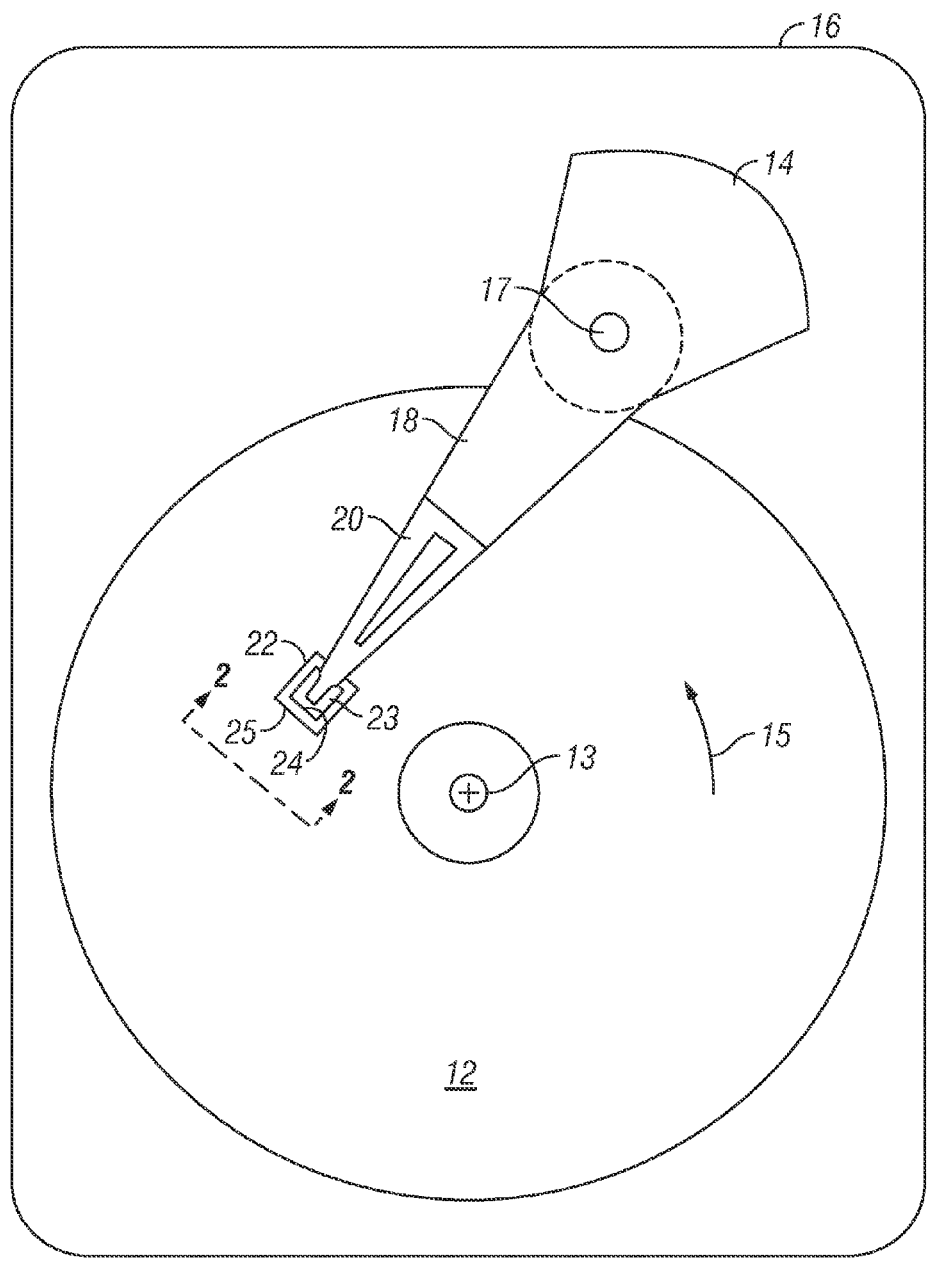
FIG. 1 is a schematic top view of a conventional magnetic recording hard disk drive with the cover removed.

The CPP magnetoresistive (MR) sensor made according to this invention has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
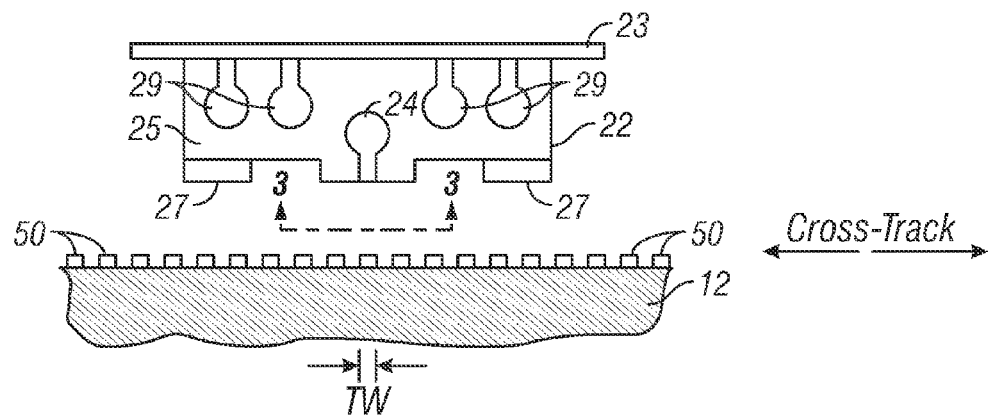
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25. As shown in the sectional view of FIG. 2, the disk 12 is a patterned-media disk with discrete data tracks 50 spaced-apart in the cross-track direction, one of which is shown as being aligned with read/write head 24. The discrete data tracks 50 have a track width TW in the cross-track direction and may be formed of continuous magnetizable material in the circumferential direction, in which case the patterned-media disk 12 is referred to as a discrete-track-media (DTM) disk. Alternatively, the data tracks 50 may contain discrete data islands spaced-apart along the tracks, in which case the patterned-media disk 12 is referred to as a bit-patterned-media (BPM) disk. The disk 12 may also be a conventional continuous-media (CM) disk wherein the recording layer is not patterned, but is a continuous layer of recording material. In a CM disk the concentric data tracks with track width TW are created when the write head writes on the continuous recording layer.

Figure 3:
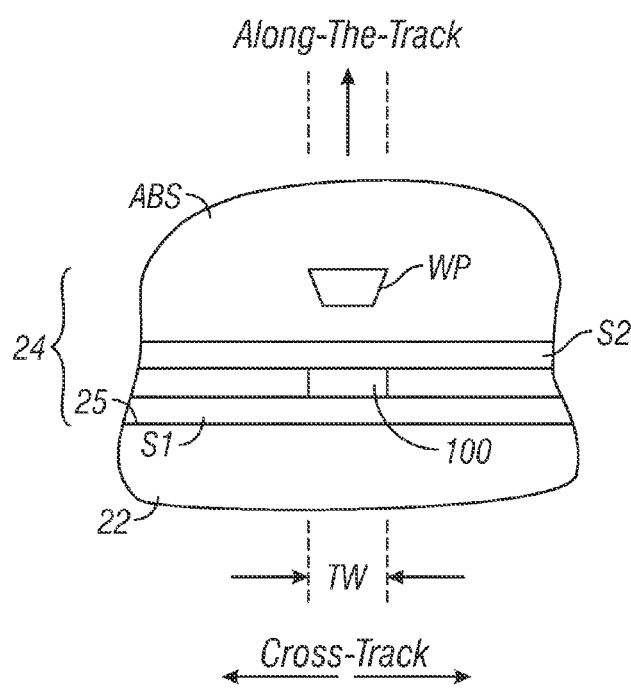
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes a perpendicular magnetic write pole (WP) and may also include trailing and/or side shields (not shown). The CPP MR sensor or read head 100 is located between two magnetic shields S1 and S2. The shields S1, S2 are formed of magnetically permeable material and are electrically conductive so they can function as the electrical leads to the read head 100. The shields function to shield the read head 100 from recorded data bits that are neighboring the data bit being read. Separate electrical leads may also be used, in which case the read head 100 is formed in contact with layers of electrically conducting lead material, such as tantalum, gold, or copper, that are in contact with the shields S1, S2. FIG. 3 is not to scale because of the difficulty in showing very small dimensions. Typically each shield S1, S2 is several microns thick in the along-the-track direction, as compared to the total thickness of the read head 100 in the along-the-track direction, which may be in the range of 20 to 40 nm.

Figure 4:
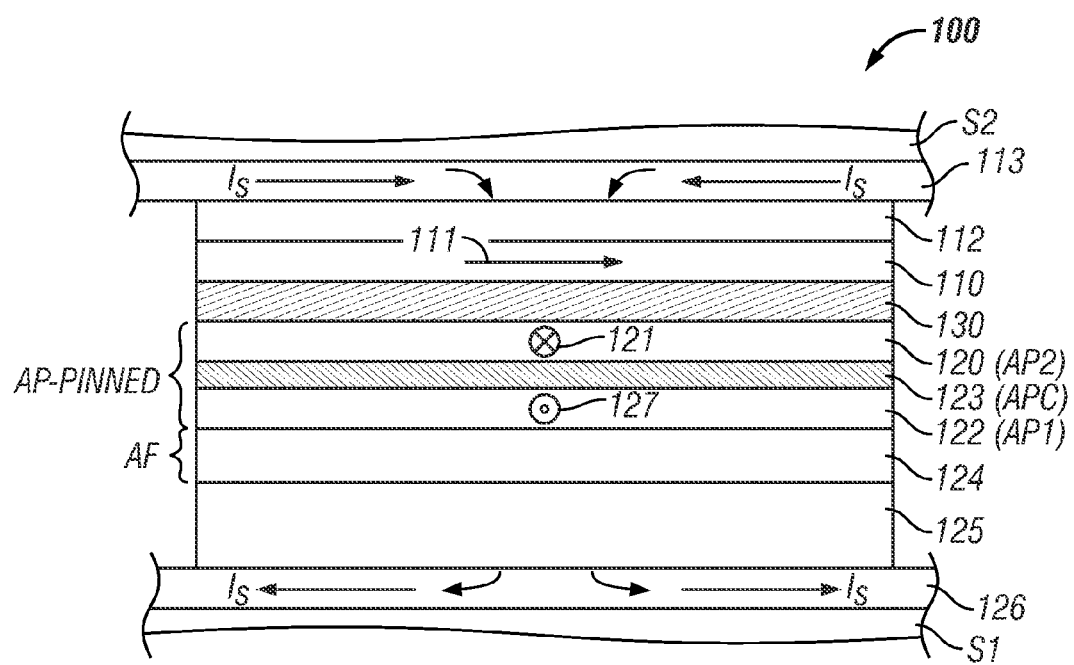
FIG. 4 is a cross-sectional schematic view of a prior art CPP-GMR read head having an antiparallel-pinned (AP-pinned) structure and showing the stack of layers located between the magnetic shield layers.

FIG. 4 is an enlarged sectional view showing the layers making up sensor 100 as would be viewed from the disk. Sensor 100 is a CPP-GMR read head comprising a stack of layers formed between the two magnetic shield layers S1, S2 that are typically electroplated NiFe alloy films. The shields S1, S2 are formed of electrically conductive material and thus may also function as electrical leads for the sense current $I_S$, which is directed generally perpendicularly through the layers in the sensor stack. Alternatively, separate electrical lead layers may be formed between the shields S1, S2 and the sensor stack. The lower shield S1 is typically polished by chemical-mechanical polishing (CMP) to provide a smooth substrate for the growth of the sensor stack. This may leave an oxide coating which can be removed with a mild etch just prior to sensor deposition. The sensor layers include an antiparallel (AP) pinned (AP-pinned) structure, a free ferromagnetic layer 110, and an electrically conductive nonmagnetic spacer layer 130, typically a metal or metal alloy like Cu, Au, Ag or their alloys, between the AP-pinned structure and the free layer 110. A capping layer 112 is located between free layer 110 and the upper shield layer S2. The capping layer 112 provides corrosion protection during processing and magnetically separates the free layer from S2 and may be a single layer or multiple layers of different conductive materials, such as Ru, Ta, NiFe or Cu.

The AP-pinned structure has first (AP1) and second (AP2) ferromagnetic layers separated by a nonmagnetic antiparallel coupling (APC) layer with the magnetization directions of the two AP-pinned ferromagnetic layers oriented substantially antiparallel. The AP2 layer 120, which is in contact with the nonmagnetic APC layer 123 on one side and the sensor's electrically nonmagnetic spacer layer 130 on the other side, is typically referred to as the reference layer 120. The AP1 layer 122, which is typically in contact with an antiferromagnetic layer 124 on one side and the nonmagnetic APC layer 123 on the other side, is the pinned layer. The AP-pinned structure minimizes the net magnetostatic coupling between the reference/pinned layers and the CPP MR free ferromagnetic layer. The AP-pinned structure, also called a "laminated" pinned layer, and sometimes called a synthetic antiferromagnet (SAF), is described in U.S. Pat. No. 5,465,185.

The APC layer 123 is typically Ru, Ir, Rh, Cr, Os or alloys thereof. The AP1 and AP2 layers are typically formed of crystalline CoFe or NiFe alloys, or a multilayer of these materials, such as a CoFe/NiFe bilayer. The AP1 and AP2 ferromagnetic layers have their respective magnetization directions 127, 121 oriented antiparallel. The AP1 layer 122 is the pinned layer that has a fixed magnetization direction that is pinned by being exchange-coupled to an antiferromagnetic (AF) pinning layer 124 as shown in FIG. 4. The AF layer 124 is typically one of the antiferromagnetic Mn alloys, e.g., PtMn, NiMn, FeMn, IrMn, PdMn, PtPdMn or RhMn, which are known to provide relatively high exchange-bias fields. Typically the Mn alloy material provides lower or little exchange-biasing in the as-deposited state, but when annealed provides stronger exchange-biasing of the pinned ferromagnetic layer 122. A seed layer 125 may be located between the lower shield layer S1 and the antiferromagnetic layer 124 and enhances the growth of the antiferromagnetic layer 124. The seed layer 125 is typically one or more layers of NiFeCr, NiFe, CoFe, CoFeB, CoHf, Ta, Cu or Ru.

The CPP GMR sensor is depicted in FIG. 4 with an AP-pinned structure with AP1 as the pinned layer 122. Alternatively, the CPP GMR sensor may have a single or simple pinned layer. In a simple pinned layer, there is no APC layer 123 and no AP2 layer 120, but only the ferromagnetic layer 122 which functions as the sensor's reference layer. The ferromagnetic layer 122 is located between the spacer layer 120 and the antiferromagnetic pinning layer 124, and has its magnetization 127 pinned by being exchange-coupled to the antiferromagnetic pinning layer 124.

The typical materials used for free layer 110, reference layer 120 and pinned layer 122 are crystalline CoFe or NiFe alloys, or a multilayer of these materials, such as a CoFe/NiFe bilayer. However, Heusler alloys, i.e., metallic compounds having a Heusler alloy crystal structure like $Co_2MnX$, for example, have been proposed for use as ferromagnetic layers in for CPP-GMR sensors. In the case of an AP-pinned structure, the Heusler alloy reference layer is usually separated from the APC layer by a crystalline ferromagnetic material such as Co or CoFe to improve the magnetic coupling between the AP1 and AP2 layers through the APC layer. Similarly, the Heusler alloy simple pinned layer is typically separated from the antiferromagnetic pinning layer by a layer of crystalline Co or CoFe to improve the coupling of the Heusler alloy layer to the antiferromagnetic layer. The insertion of an amorphous CoFeB ferromagnetic layer at the interface between the Co or CoFe crystalline layer and the Heusler alloy pinned layer has been suggested to block the diffusion of Mn from the antiferromagnetic pinning layer to the Heusler alloy pinned layer. In the conventional method for fabrication of a CPP sensor with a Heusler alloy pinned layer and a CoFeB interface layer, all of the layers from the seed layer to the capping layer, including the Mn-containing antiferromagnetic pinning layer, the CoFe crystalline layer and the CoFeB interface layer, are deposited as full films on S1, typically by sputter deposition. Then a high-temperature anneal is performed in a magnetic field (either in the deposition chamber, or more commonly in an external annealing oven). This produces the required exchange biasing effect of the antiferromagnetic pinning layer and results in the microstructural improvement of both the antiferromagnetic pinning layer and the Heusler alloy pinned layer. The structure is then lithographically patterned and etched to define the sensor track width (TW) on the ABS (see FIG. 3) and sensor stripe height (SH), i.e., the height of the sensor orthogonal to the ABS.

However, as part of the development of the method of this invention it has been discovered that during high-temperature annealing the amorphous CoFeB can crystallize into a crystalline layer due to the diffusion of boron from the CoFeB. This may allow Mn from the antiferromagnetic pinning layer to migrate through the grain boundaries formed in the crystalline CoFeB layer. Thus the insertion of an amorphous CoFeB layer, followed by deposition of the remaining sensor layers and high-temperature annealing does not effectively block the Mn diffusion, and also adds another mobile element, boron, which may also adversely affect the ferromagnetic layers.

In the method for making the CPP-GMR sensor of this invention, a layer of an amorphous X-containing ferromagnetic alloy is inserted as a diffusion blocking layer between the Co or CoFe crystalline layer and the Heusler alloy pinned layer and an in-situ annealing is performed before deposition of the remaining layers in the sensor stack. The element X is tantalum (Ta), titanium (Ti), zirconium (Zr), niobium (Nb), silicon (Si) or tungsten (W). The amorphous ferromagnetic layer comprises an alloy of one or more of cobalt (Co), iron (Fe) and nickel (Ni) that also contains sufficient boron (B) to render the alloy substantially amorphous. The preferred amorphous X-containing ferromagnetic layer is a CoFeBTa layer. After in-situ annealing of the CoFeBTa layer, the remaining sensor layers are then deposited up through the Heusler alloy layers, followed by a second high-temperature annealing step to improve the microstructure of the Heusler alloy. The remaining sensor layers up through the capping layer are deposited, followed by a longer lower-temperature annealing in the presence of a magnetic field to induce magnetic anisotropy in the antiferromagnetic layer and thus cause exchange-biasing of the pinned layer.

Figure 5:
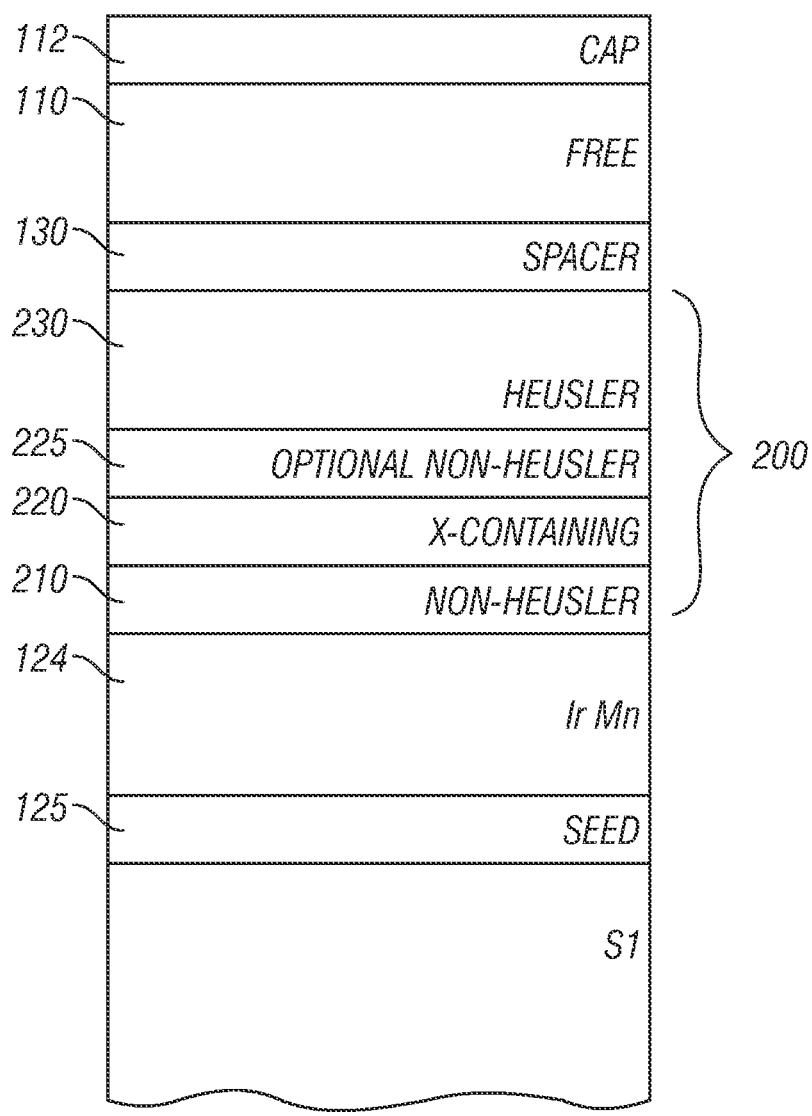
FIG. 5 is a cross-sectional schematic view of the structure made according to the method of this invention.

FIG. 5 is a sectional view showing the CPP-GMR sensor made according to the method of this invention. The substrate is shield layer S1. A seed layer 125, for example a bilayer of Ru on Ta, is deposited on S1. The antiferromagnetic layer 124 is an electrically conductive antiferromagnetic Mn-alloy layer, but is preferably an alloy consisting essentially of IrMn, for example a $Ir_{80}Mn_{20}$ alloy, where the subscripts represent atomic percent. The antiferromagnetic layer 124 has a typical thickness in the range of about 30 to 80 Å.

The pinned layer 200 is a multilayer of a first crystalline non-Heusler alloy ferromagnetic layer 210 on and in contact with the IrMn antiferromagnetic layer 124, a substantially amorphous X-containing ferromagnetic layer 220, an optional second crystalline non-Heusler alloy ferromagnetic layer 225, and a Heusler alloy layer 230. The amorphous X-containing ferromagnetic layer 220 is a diffusion blocking layer located between the non-Heusler alloy layer 210 and the Heusler alloy layer 230 (or the optional non-Heusler alloy layer 225). The crystalline non-Heusler alloy for layer 210 (and optional layer 225) may be a ferromagnetic alloy comprising a layer or multilayer of or more of Co, Fe and Ni, but is preferably a single layer of a CoFe alloy, like $Co_2Fe$, with a thickness in the range of about 1 to 15Å. The non-Heusler alloy layer 210 (and optional layer 225) may alternatively be a multilayer, such as a bilayer of Co and CoFe. The pinned layer 200 is depicted as a simple pinned layer, but alternatively layer 200 may be the AP1 layer of an AP-pinned structure.

The Heusler alloy layer 230 is formed of a material selected from $Co_2MnX$ (where X is one or more of Ge, Si, Sn, Ga or Al), $Co_2FeZ$ (where Z is one or more of Ge, Si, Al, Sn or Ga) and $CoFe_xCr_{(1-x)}Al$ (where x is between 0 and 1) with a typical thickness in the range of about 10 to 60 Å. As an alternative to the above-described Heusler alloys, layer 230 may be formed of a non-Heusler alloy of the form $(Co_y Fe_{(100-y)})_{(100-z)}X_z$ (where X is one or more of Ge, Al, Si or Ga, y is between about 45 and 55 atomic percent, and z is between about 20 and 40 atomic percent). This material, like the Heusler alloy materials, also requires high-temperature post-deposition annealing. The preferred type of this CoFeX material is CoFeGe, which is described in U.S. Pat. No. 7,826,182 B2 for use in CPP-MR sensors.

The preferred amorphous X-containing ferromagnetic layer 220 is a CoFeBTa layer with a typical thickness in the range of about 1 to 10 Å. The CoFeBTa alloy may have a composition of $(CoFe)_{(100-x-y)}B_xTa_y$, where the subscripts are in atomic percent, $10 \leq x \leq 30$ and $5 \leq y \leq 10$ and the CoFe may have between about 10 and 90 atomic percent Co. While Ta is the preferred material to be included in the amorphous X-containing ferromagnetic layer 220, other materials may function as well. These include Ti, Zr, Nb, Si and W. Thus, for example, the layer 220 may be a layer of CoFeBX, where X is one or more of Ta, Ti, Zr, Nb, Si and W. The amorphous X-containing ferromagnetic is substantially non-crystalline, meaning that it may be amorphous or nanocrystalline, i.e., localized small crystallites but no significant long range ordering. It is believed that the substantially non-crystalline structure of the amorphous X-containing ferromagnetic layer 220 enhances the crystalline structure of the Heusler alloy layer 230 during subsequent annealing. The amorphous X-containing ferromagnetic layer 220 should not be in contact with the antiferromagnetic layer 124 because the X material would reduce the exchange coupling with the antiferromagnetic layer 124. Thus it is important that the non-Heusler alloy layer 210, which separates the amorphous X-containing ferromagnetic layer 220 from the antiferromagnetic layer 124, not contain any X material.

The sensor of FIG. 5 is depicted with just the pinned layer 200 comprising a Heusler alloy. However, the sensor may also have just the free layer 110 or both the free layer 110 and pinned layer 200 formed of a Heusler alloy, or a non-Heusler CoFeX alloy (where where X is one or more of Ge, Al, Si or Ga), because such a sensor will require high-temperature post-deposition annealing that can cause Mn diffusion form the antiferromagnetic layer.

In the fabrication of the CPP-GMR sensor shown in FIG. 5, all of the layers up through and including the amorphous X-containing ferromagnetic layer 220 (e.g., the CoFeBTa layer), are deposited sequentially on S1, typically by sputtering in a vacuum chamber. Then, without breaking vacuum, an in-situ annealing is performed at a temperature between about 250-400° C. for between about 1-60 minutes, for example at about 375° C. for about 15 minutes. This annealing step is believed to cause some diffusion of the B from the CoFeBTa layer 220 into the CoFe non-Heusler alloy layer 210. The structure is allowed to cool, for example for about 30 minutes. Then the layers up through and including the last Heusler alloy layer are deposited, followed by a second in-situ annealing step at a higher temperature between about 300-550° C. for between about 1-60 minutes. The second annealing step is the high-temperature annealing required to form the proper microstructure of the Heusler alloy layer. In the example of FIG. 5, this last Heusler alloy layer is layer 230 forming the pinned layer 200. However, if the free layer 110 is also to be a Heusler alloy layer, or is the only Heusler alloy layer in the sensor, then it is the last layer deposited before the second annealing step. Because of the first in-situ annealing, the second higher-temperature annealing, which is required because of the use of the Heusler alloy material in one or more of the ferromagnetic layers, substantially minimizes Mn diffusion from the antiferromagnetic layer 124. Then, the remaining layers up through the capping layer 112 are deposited. Then a final post-deposition annealing, and subsequent cooling, is performed, either in-situ or after removal from the deposition chamber, in the presence of a magnetic field. This is done at a maximum temperature between about 200-400° C. for between about 0.5-50 hours and induces strong exchange-biasing of the pinned layer 200 in contact with the antiferromagnetic layer 124.

The relative extent of Mn diffusion from the antiferromagnetic layer was measured for two structures: a structure made according to this invention and a control structure which was an identical structure made according to the same method, but without the first in-situ annealing. The antiferromagnetic layer 124 was 60 Å $Ir_{20}Mn_{80}$, the non-Heusler alloy layer 210 was 3 Å Co, the amorphous X-containing ferromagnetic layer 220 was 3 Å $(Co_{75}Fe_{25})_{72}B_{20}Ta_8$, the optional non-Heusler alloy Heusler alloy layer 225 was 3 Å $Co_{50}Fe_{50}$, and the Heusler alloy layer 230 was 50 Å $Co_{50}Fe_{25}Al_{12.5}Si_{12.5}$, wherein all of the subscripts are atomic percent. The relative extent of Mn diffusion was measured by glow-discharge optical emission spectroscopy, which showed significantly less Mn diffusion for the structure made according to the method of the invention.

Figure 6:
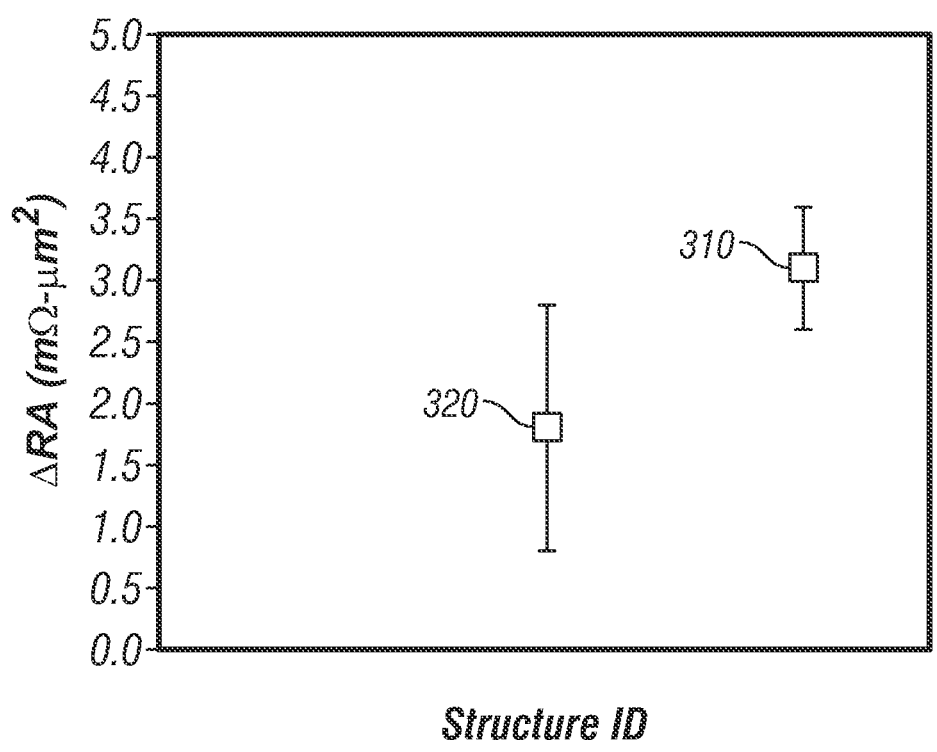
FIG. 6 shows the measured magnetoresistance (in terms of change in resistance-area product ΔRA) for a number of samples of two structures: a structure made according to the method of this invention and a control structure which was an identical structure made according to the same method, but without the first in-situ annealing.

FIG. 6 shows the measured magnetoresistance (in terms of resistance-area product ΔRA) for a number of samples of these two structures, with a data point representing the average value and error bars representing the standard deviation within the measured data. The structure 310 made according to the method of this invention shows not only higher average ΔRA, but also much better clustering of the ΔRA values (smaller standard deviation) than for the control structure 320.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for making a current-perpendicular-to-the-plane (CPP) magnetoresistive sensor having a pinned layer comprising:

providing a substrate in a vacuum chamber;

depositing on the substrate a pinning layer of a Mn alloy capable of becoming antiferromagnetic; and forming on the pinning layer a multilayer pinned layer comprising the steps of:

depositing on the Mn alloy layer a non-Heusler alloy ferromagnetic layer;

depositing on the non-Heusler alloy ferromagnetic layer a layer of a ferromagnetic alloy comprising B and one or more of Ta, Ti, Zr, Nb, Si and W;

after depositing said ferromagnetic alloy comprising B and one or more of Ta, Ti, Zr, Nb, Si and W, performing a first annealing in the vacuum chamber by subjecting the deposited layers to a temperature between 250-400° C for between 1-60 minutes;

after said first annealing, depositing at least one layer of material selected from a Heusler alloy material and a non-Heusler alloy material of the form $(Co_yFe_{(100-y)})_{(100-z)}X_z$ (where X is one or more of Ge, Al, Si or Ga, y is between about 45 and 55 atomic percent, and z is between about 20 and 40 atomic percent); and performing a second annealing in the vacuum chamber by subjecting the deposited layers to a temperature between 300-550° C for between 1-60 minutes to thereby form said multilayer pinned layer;

after said second annealing step, depositing a nonmagnetic spacer layer on said layer of material selected from a Heusler alloy material and a non-Heusler alloy material of the form $Co_yFe_{(100-y)})_{(100-z)}X_z$ (where X is one or more of Ge, Al, Si or Ga, y is between about 45 and 55 atomic percent, and z is between about 20 and 40 atomic percent), and a non-Heusler alloy ferromagnetic free layer on the nonmagnetic spacer layer.

2. The method of claim 1 wherein depositing a non-Heusler alloy ferromagnetic layer comprises depositing a first non-Heusler alloy ferromagnetic layer, and further comprising, after said first annealing and prior to depositing said at least one layer of material selected from a Heusler alloy material and a non-Heusler alloy of the form $(Co_yFe_{(100-y)})_{(100-z)}X_z$, depositing a second non-Heusler alloy ferromagnetic layer.

3. The method of claim 1 wherein depositing said at least one layer of material selected from a Heusler alloy material and a non-Heusler alloy of the form $(Co_yFe_{(100-y)})_{(100-z)}X_z$ comprises depositing said at least one layer of material selected from a Heusler alloy material and a non-Heusler alloy of the form $(Co_yFe_{(100-y)})_{(100-z)}X_z$ directly on and in contact with said layer of a ferromagnetic alloy comprising B and one or more of Ta, Ti, Zr, Nb, Si and W.

4. The method of claim 1 wherein said layer of a ferromagnetic alloy comprising B and one or more of Ta, Ti, Zr, Nb, Si and W consists essentially of a layer of an alloy having the composition $(CoFe)_{(100-x-y)}B_xTa_y$, where the subscripts are in atomic percent, $10 \le x \le 30$ and $5 \le y \le 10$.

5. The method of claim 1 wherein said Mn alloy consists essentially of IrMn.

6. The method of claim 1 wherein said Heusler alloy material is selected from $Co_2MnX$ (where X is one or more of Ge, Si, or Al), $Co_2FeZ$ (where Z is one or more of Ge, Si, Al or Ga) and $CoFe_xCr_{(1-x)}Al$ (where x is between 0 and 1).

7. The method of claim 1 wherein X is Ge in said non-Heusler alloy material of the form $(Co_yFe_{(100-y)})_{(100-z)}X_z$ (where X is one of more of Ge, Al, Si or Ga, y is between about 45 and 55 atomic percent, and z is between about 20 and 40 atomic percent).

8. The method of claim 1, further comprising depositing a capping layer on the non-Heusler alloy ferromagnetic free layer and thereafter performing a third annealing in the presence of a magnetic field by subjecting the deposited layers to a temperature between 200-400° C for between 0.5-50 hours to thereby increase the exchange coupling between the antiferromagnetic layer and the non-Heusler alloy ferromagnetic layer.

9. A method for making a current-perpendicular-to-the-plane (CPP) magnetoresistive sensor having an antiparallel (AP) pinned structure comprising a first AP-pinned (AP1) ferromagnetic layer, a second AP-pinned (AP2) ferromagnetic layer, and an AP coupling (APC) layer between and in contact with the AP1 and AP2 layers, wherein said AP1 layer comprises a Heusler alloy ferromagnetic layer, the method comprising:
providing a substrate in a vacuum chamber;
depositing on the substrate a Mn-containing layer capable of becoming antiferromagnetic;
depositing on and in contact with the Mn-containing layer a first ferromagnetic layer selected from Co and a non-Heusler alloy comprising Co and Fe;
depositing on and in contact with said first ferromagnetic layer a ferromagnetic diffusion blocking layer comprising Co, B and one or more of Ta, Ti, Zr, Nb, Si and W;
performing a first annealing in the vacuum chamber by subjecting the deposited layers to a temperature between 250-400° C. for between 1-60 minutes;
after said first annealing, depositing on said diffusion blocking layer said AP1 layer Heusler alloy material selected from $Co_2MnX$ (where X is one or more of Ge, Si, or Al), $Co_2FeZ$ (where Z is one or more of Ge, Si, Al or Ga) and $CoFe_xCr_{(1-x)}Al$ (where x is between 0 and 1);
performing a second annealing in the vacuum chamber by subjecting the deposited layers to a temperature between 300-550° C. for between 1-60 minutes; and
after said second annealing, depositing said APC layer on said Heusler alloy AP1 layer and said AP2 layer on said APC layer.

10. The method of claim 9 wherein depositing said AP1 Heusler alloy layer comprises depositing said Heusler alloy layer on and in contact with said diffusion blocking layer.

11. The method of claim 9 further comprising, after said first annealing and before depositing said AP1 Heusler alloy layer, depositing on and in contact with said diffusion blocking layer a second ferromagnetic layer selected from Co and a non-Heusler alloy comprising Co and Fe; and wherein depositing said AP1 Heusler alloy layer comprises depositing said AP1 Heusler alloy layer on and in contact with said second ferromagnetic layer.

12. The method of claim 9 wherein said diffusion blocking layer consists essentially of a layer of an alloy having the composition $(CoFe)_{(100-x-y)}B_xTa_y$, where the subscripts are in atomic percent, $10 \le x \le 30$ and $5 \le y \le 10$.

13. The method of claim 9 wherein the Mn-containing layer consists essentially of IrMn.

\* \* \* \* \*